(12) United States Patent
Hong

(10) Patent No.: US 11,451,217 B2
(45) Date of Patent: Sep. 20, 2022

(54) MATCH-SLAVE LATCH WITH SKEWED CLOCK

(71) Applicant: Taiwan Semiconductor Manufacturing Company, Ltd., Hsinchu (TW)

(72) Inventor: Hyunsung Hong, Kanata (CA)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/075,759

(22) Filed: Oct. 21, 2020

(65) Prior Publication Data

US 2021/0126628 A1 Apr. 29, 2021

Related U.S. Application Data

(60) Provisional application No. 62/926,601, filed on Oct. 28, 2019.

(51) Int. Cl.
*H03K 3/037* (2006.01)
*H03K 19/20* (2006.01)

(52) U.S. Cl.
CPC .......... *H03K 3/0372* (2013.01); *H03K 19/20* (2013.01)

(58) Field of Classification Search
CPC .... H03K 3/012; H03K 3/0372; H03K 3/0375; H03K 3/35625; H03K 3/289
USPC ................................................. 327/202–203
See application file for complete search history.

(56) References Cited

U.S. PATENT DOCUMENTS

| 6,069,498 | A | * | 5/2000 | Noll | .......... | G11C 7/22 327/49 |
|---|---|---|---|---|---|---|
| 6,239,639 | B1 | * | 5/2001 | Yaoi | ..... | H03K 3/0372 327/199 |
| 6,452,433 | B1 | * | 9/2002 | Chang | ........ | H03K 3/0372 327/201 |
| 7,772,889 | B2 | * | 8/2010 | Naffziger | ...... | H03K 3/0375 326/93 |
| 8,988,124 | B2 | * | 3/2015 | Yokoyama | ..... | H03K 3/356156 327/203 |
| 2013/0021076 | A1 | * | 1/2013 | Kuenemund | .... | H03K 3/356008 327/202 |

(Continued)

FOREIGN PATENT DOCUMENTS

JP 03277010 A * 12/1991
JP 09139467 A * 5/1997

*Primary Examiner* — Quan Tra
(74) *Attorney, Agent, or Firm* — Jones Day

(57) ABSTRACT

Circuits, systems, and methods are described herein for generating master clock signals and slave clock signals for controlling a flip-flop having a master latch and a slave latch. A circuit includes a master latch configured to latch an input data signal and to output a data latch signal based on a master clock signal. The circuit also includes a slave latch coupled to the master latch and configured to generate an output data signal based on a slave latch clock signal and the data latch signal. Additionally, the circuit includes a skewed clock circuit coupled to the master latch and the slave latch. The skewed clock circuit is configured to receive a clock signal and generate the master clock signal and the slave clock signal based on the clock signal. The master clock signal and the slave clock signal are independent clock signals whose timing is skewed relative to one another by the skewed clock circuit.

20 Claims, 7 Drawing Sheets

(56) References Cited

U.S. PATENT DOCUMENTS

2013/0154708 A1\* 6/2013 Zhang .............. H03K 3/356156
  327/202
2016/0072484 A1\* 3/2016 Jarrar ................. H03K 3/35625
  327/202

\* cited by examiner

MATCH-SLAVE LATCH WITH SKEWED CLOCK

PRIORITY CLAIM

This application claims priority to U.S. Provisional Application No. 62/926,601, filed Oct. 28, 2019, the contents of which are incorporated herein by reference in its entirety.

TECHNICAL FIELD

This relates to semiconductor devices and more particularly to latches.

BACKGROUND

Latches are logic circuits that can be used to store information. A master-slave latch (e.g., flip-flop) is a clock edge triggered device. In other words, the output of a master-slave latch changes based on when the clock signal changes. Master-slave latches can utilize a common clock. Use of a common clock can cause timing margin issues often resolved with one or more buffers to inject additional time delay.

BRIEF DESCRIPTION OF THE DRAWINGS

Aspects of the present disclosure are best understood from the following detailed description when read with the accompanying figures.

DETAILED DESCRIPTION

Figure 1:
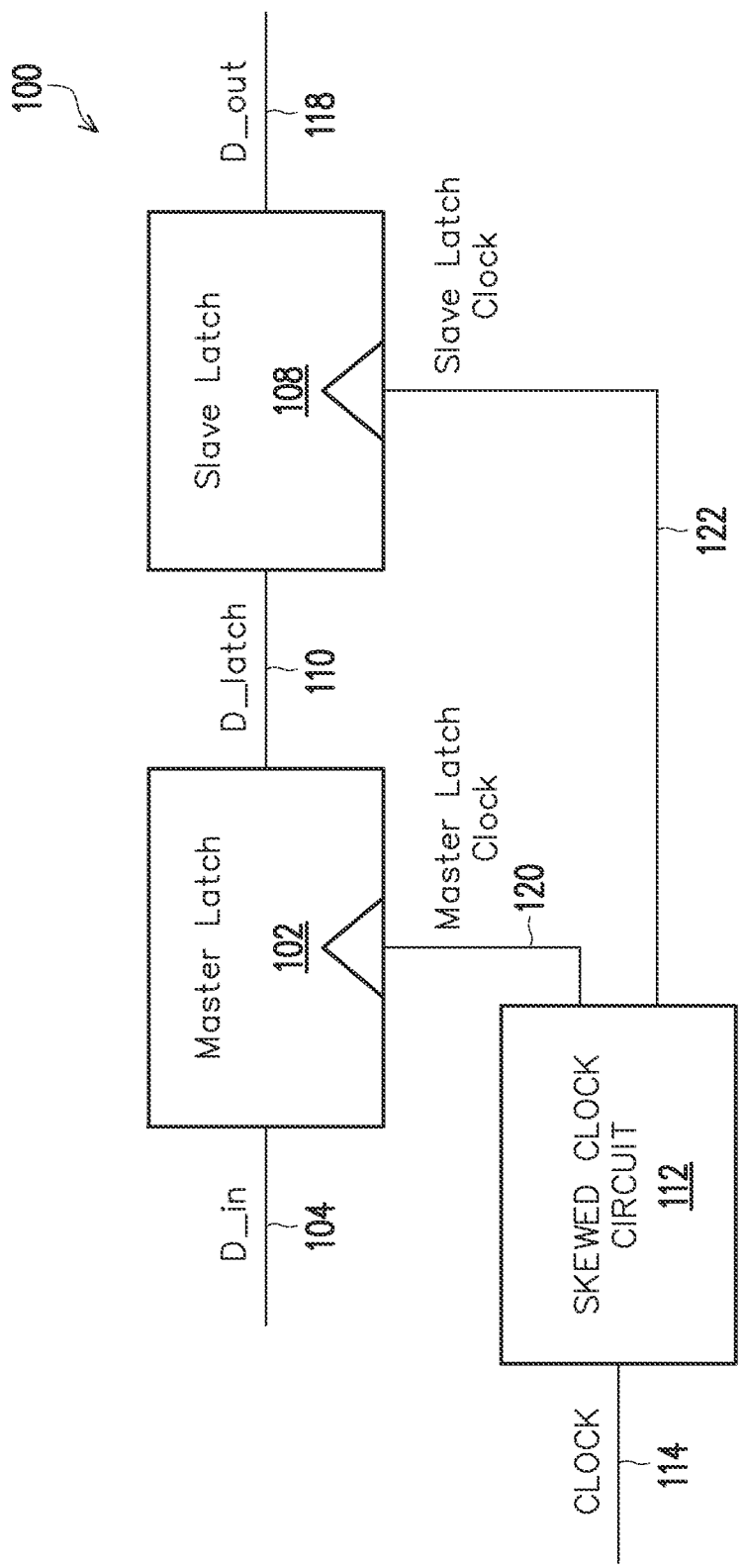
FIG. 1 depicts a block diagram of a master-slave flip-flop in accordance to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Flip-flops are a type of synchronous circuit that depends on timing signals. A data flip-flop (e.g., D flip-flop) receives a digital clock signal (e.g., 0 or 1) and a data signal as input. The output of the flip-flop is dependent upon the state of digital clock signal and are known as edge-triggered devices. When the clock signal transitions from a logic low (e.g., '0') to a logic high (e.g., '1'), the clock signal is said to be "rising." Positive-edge triggered flip-flops output data equal to the input data when the clock signal is rising and holds the output at its previous value for all other times. Alternatively, when the clock signal transitions from a logic high (e.g., '1') to a logic low (e.g., '0'), the clock signal is said to be "falling." Negative-edge flip-flops output data equal to the input data when the clock signal is falling and holds the output at its previous value for all other times. Flip-flops may utilize one or more latches (e.g., a master latch and a slave latch), each responsive to a clock signal, to provide this functionality.

There are two key times associated with flip-flops that can impact the accuracy and/or stability of the output signal: (i) a setup time and (ii) a hold time. A setup time is an amount of time a data input into the flip-flop must be stable before a clock edge of an input clock signal. The hold time is a minimum amount of time that an input of a flip-flop must be stable after a clock edge of an input clock signal. In other words, there is a timing window surrounding a clock edge (e.g., before the clock edge and after the clock edge) where a data input must remain stable in order for the flip-flop to operate. A skewed block circuit is described herein that generates and provides individual clock signals sent to both the master latch and the slave latch. These individual clock signals are skewed by adding different delays to each clock signal. The skewing of the clock signals changes the time at which the latches receive a clock edge. By individually controlling the delays of the clock signals provided to the latches, the overall setup time can be decreased (e.g., a faster setup time).

FIG. 1 depicts a block diagram of a master-slave flip-flop 100 in accordance to various embodiments of the present disclosure. The master-slave flip-flop 100 includes a master latch 102 and a slave latch 108. The master latch 102 includes an input node configured to receive an input data signal 104 (e.g., D_in). In an example, the data signal 104 is propagated to the master-slave flip-flop 100 via combinational logic of a sequential circuit. The master latch 102 is further configured to receive a master latch clock signal 120. The master latch clock signal 120 is provided by skewed clock circuit 112 and is based on an input clock signal 114 that is received by the skewed clock circuit 112.

The master-slave flip-flop 100 of FIG. 1 further includes the slave latch 108, which is configured to receive the data latch signal 110 output from the master latch 102. The slave latch 108 is further configured to receive a slave latch clock signal 122, which is provided by the skewed clock circuit 112 and is based on the input clock signal 114. An output node, D_out, 118 of the master-slave flip-flop 100 is included on the slave latch 108 and is used to read data out of the master-slave flip-flop 100. In an example, the master-slave flip-flop 100 includes a storage cell that provides data storage.

Figure 2:
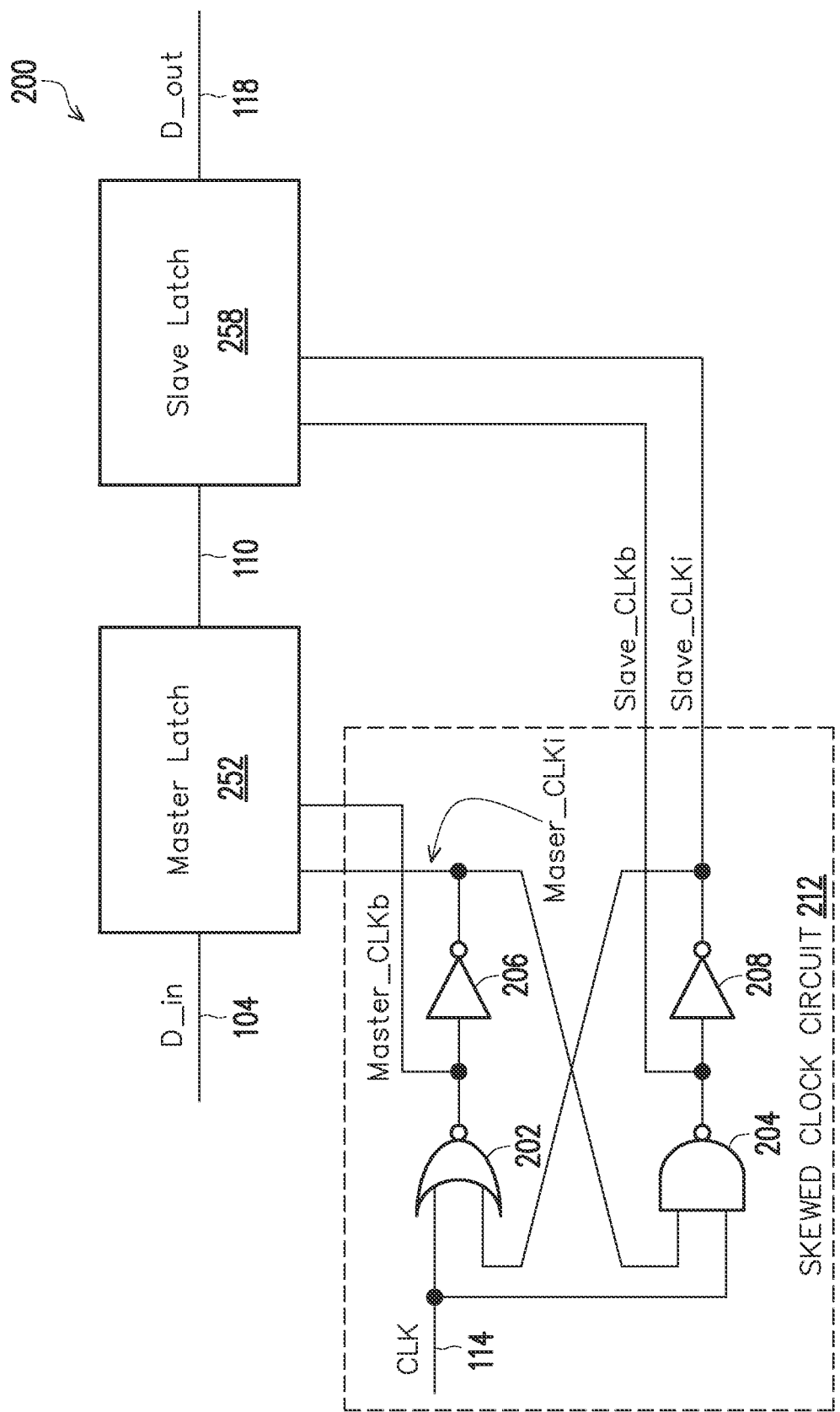
FIG. 2 depicts a diagram of a master-slave flip flop coupled to a skewed clock circuit in accordance with various embodiments of the present disclosure.
Figure 3:
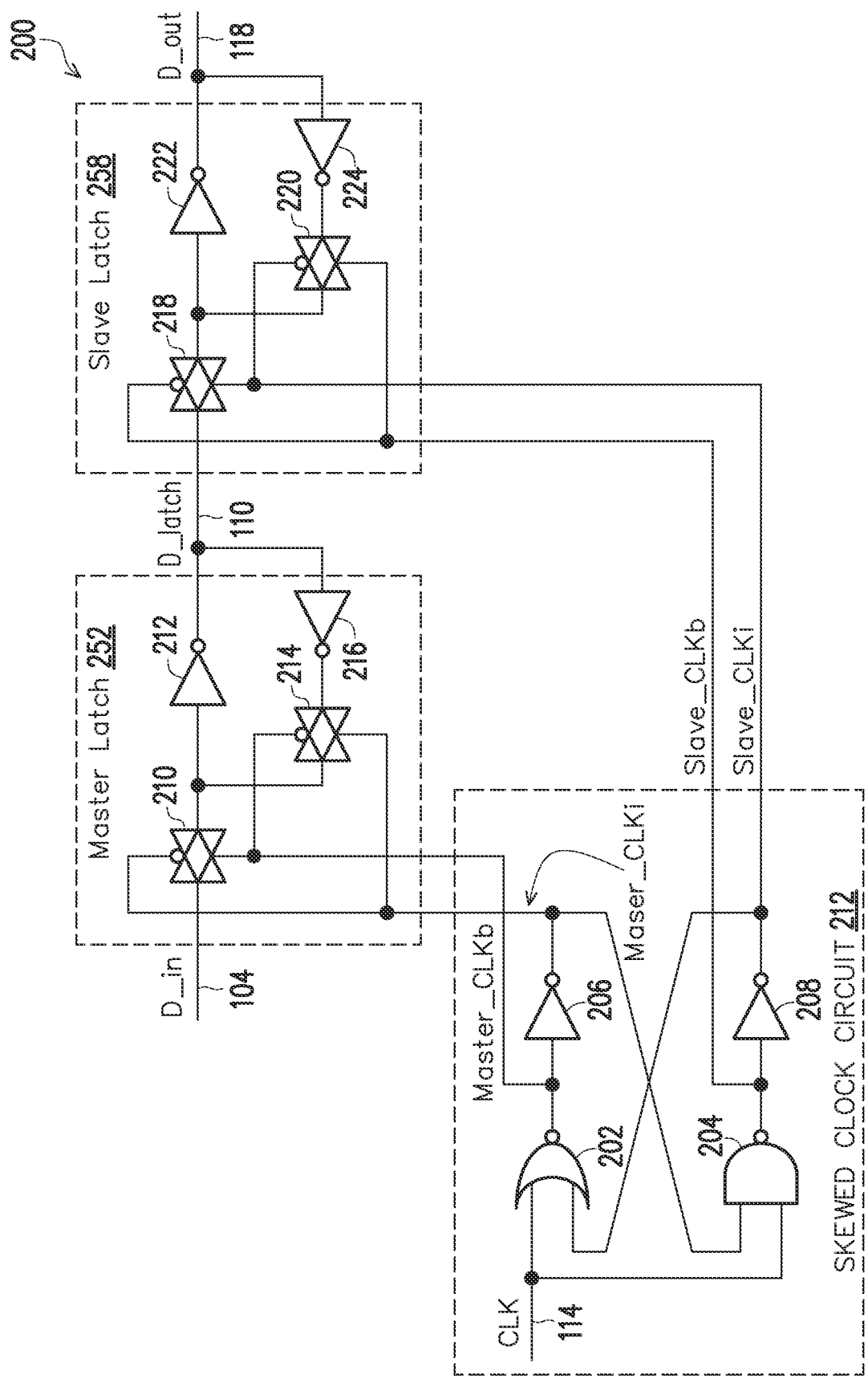
FIG. 3 further illustrates the coupling of a master-slave flip flop coupled to a skewed clock circuit in accordance with various embodiments of the present disclosure.

In some variations when the input clock signal 114 is low, the master latch clock signal 120 is delayed as described in more detail in FIGS. 2-3, the master latch 102 is transparent (e.g., ready to sample and store a data value) and the slave latch 108 is opaque (e.g., not sampling, but instead holding a previously sampled data value). In this variation, when the input clock signal 114 goes high, the slave latch clock signal 122 is delayed as described in more detail in FIGS. 2-3, the master latch 102 becomes opaque, and the slave latch 108 becomes transparent to effect a positive edge-triggered behavior.

Alternatively, in another example embodiment, when the input clock signal 114 is high, the master latch 102 is transparent and the slave latch 108 is opaque. In this variation, when the input clock signal 114 goes low, the master latch 102 becomes opaque, and the slave latch 108 becomes transparent to effect a negative edge-triggered behavior. Thus, the master-slave flip-flop 100 may be a positive edge-triggered flip-flop or a negative edge-triggered flip-flop.

The clock signals 120, 122 provided to the master and slave latches 102, 108, respectively, are generated by the skewed clock circuit 112. As explained in further detail below with respect to FIGS. 2-5, the skewed clock circuit 112 is configured to receive the input clock signal 114 and generate the master latch clock signal 120 and slave latch clock signal 122 based on the input clock signal 114.

FIG. 2 depicts a diagram of a master-slave flip flop 200 coupled to a skewed clock circuit 212 in accordance with various embodiments of the present disclosure. As previously described in FIG. 1, a skewed clock circuit, such as skewed clock circuit 212, generates and provides individual clock signals (e.g., master clock signal, Master_CLKb, and slave clock signal, Slave_CLKb) to master latch 252 and slave latch 258, respectively. Master latch 252 operates similar to master latch 102 described in FIG. 1. Slave latch 258 operates similar to slave latch 108 described in FIG. 1. In addition to these clock signals, skewed clock circuit 212 can generate and provide inverted versions of both clock signals (e.g., an inverted master clock signal, Master_CLKi and an inverted slave clock signal, Slave_CLKi). In some variations, skewed clock circuit 212 includes a plurality of logic gates such as NOR gate 202, NAND gate 204, and inverters 206, 208. Skewed clock circuit 212 receives an input clock signal 114 (e.g., CLK). Input clock signal 114 is provided as input to both NOR gate 202 and NAND gate 204. NOR gate 202 compares the input clock signal 114 with an inverted slave clock signal (e.g., Slave_CLKi) output by inverter 208. When both the input clock signal 114 and the inverted slave clock signal (e.g., Slave_CLKi) are logic lows (e.g., '0'), the NOR gate 202 generates a master clock signal (e.g., Master_CLKb) that is a logic high (e.g., '1'). For all other combinations of inputs, the master clock signal generated by NOR gate 202 is a logic low. Inverter 206 generates an inverted master clock signal that is the logical opposite of the master clock signal. Both the master clock signal and the inverted master clock signal are provided as inputs to the master latch 102.

The inverted master clock signal is also provided as another input to the NAND gate 204. NAND gate 204 compares the input clock signal 114 with the inverted master clock signal. When the input clock signal 114 and the inverted master clock signal are both logic highs, the slave clock signal generated by NAND gate 204 is a logic low. For all other logical combinations of inputs, the slave clock signal generated by NAND gate 204 is a logic high. Inverter 208 generates an inverted slave clock signal which is the logic opposite of the slave clock signal generated by NAND gate 204. Both the slave clock signal and the inverted slave clock signal are provided as inputs to the slave latch 108.

FIG. 3 further illustrates the coupling of a master-slave flip flop 200 coupled to a skewed clock circuit 212 in accordance with various embodiments of the present disclosure. Master latch 252 includes a plurality of transistors and inverters. More specifically, master latch 252 includes transmission gates 210, 214 and inverters 212, 216. A transmission gate is a bilateral switch that can be implemented using PMOS and NMOS transistors. The output of a transmission gate is based upon the logic levels of both the data input signal and control input. When the control input of a transmission gate is a logic high, the output of the transmission gate mirrors that of the input signal (e.g., transmission gate acts like an closed switch). When the control input of the transmission gate is a logic low, the transmission gate acts like an open switch.

Turning back to FIG. 3, a control terminal of transmission gate 210 receives the master clock signal output by NAND gate 204 and the inverted control terminal of transmission gate 210 receives the inverted master clock signal output by inverter 206. In other words, the transmission gate 210 is controlled by the master clock signal. When the master clock signal is a logic high, the transmission gate 210 acts as a closed switch and the input data signal 104 is provided as an input to inverter 212 which is coupled to the transmission gate 210. Inverter 212 generates the opposite logic signal as its input and outputs that as a data latch signal (e.g., D latch 110) provided to slave latch 258, which will be discussed in more detail below. Under these conditions (e.g., master clock latch being a logic high), the data latch signal is the logical opposite of the input data signal.

Just the opposite of transmission gate 210, the transmission gate 214 is controlled by the inverted master clock signal. Transmission gate 214 receives the master clock signal output by NAND gate 204 at the inverted control terminal and the control terminal of transmission gate 214 receives the inverted master clock signal output by inverter 206. The input to the transmission gate 214 is coupled to an output of inverter 216. Inverter 216 inverts the data latch signal output from inverter 212 and generates a signal that is the logical opposite of the data latch signal. When the master clock signal is a logic high, the inverted master clock signal is a logic low. With a logic low control signal, transmission gate 214 acts as an open switch and the inverter 216 is floating. Alternatively, when the master clock signal is a logic low, the inverted master clock signal is a logic high. The inverted master clock signal controls the transmission gate 214, which for the reasons previously discussed causes the transmission gate to act as a closed switch. With transmission gate 214 as a closed switch, the output of inverter 216 is coupled to the input of inverter 212. The transmission gate 210 acts as an open circuit as the control signal under these circumstances (e.g., master control signal) is a logic low. For the time that the master control signal is a logic low, the data input signal 104 is no longer provided to the input of inverter 212. Instead, the input to inverter 212 is the output of inverter 216 passed through transmission gate 214. When the data latch signal is a logic high, inverter 216 outputs a logic low which is passed through the closed switch of transmission gate 216 to inverter 212. That logic low is then converted by inverter 212 back to a logic high. Alternatively, when the data latch signal is a logic low, inverter 216 outputs a logic high. That logic high is passed through the closed switch of transmission gate 214 to the input of inverter 212. Inverter 212 converts the logic high back to a logic low. In other words, when the master clock signal is a logic low, the data latch signal 110 output by master latch 252 is maintained at its prior state (e.g., the state when master clock signal was a logic high right before switching to a logic low).

The data latch signal 110 is provided as an input to slave latch 108. More specifically, slave latch 258, like master latch 252, includes a plurality of transistors and inverters. Namely, transmission gates 218, 220 and inverters 222, 224. A control terminal of transmission gate 218 receives the inverted slave clock signal output by inverter 208 of skewed clock circuit 212. The inverted control terminal of transmission gate 218 receives the slave clock signal output by NAND gate 204. In other words, the transmission gate 218 is controlled by the inverted slave clock signal (e.g., Slave_CLKi). The transmission gate 218 receives the data latch signal 110 output by master latch 102. When the inverted slave clock signal is a logic high, the transmission gate 218 acts as a closed switch and the data latch signal 110 is provided as an input to inverter 222 which is coupled to the output of transmission gate 218. Inverter 222 generates the opposite logic signal as its input and outputs that as an data output signal 118 (e.g., D_out). Under these conditions (e.g., inverted slave clock signal being a logic high), the data output signal 118 is an inverted data latch signal. Because the master latch 252 and slave latch 258 are driven by independently controlled clock signals (e.g., master latch controlled by master clock signals and slave latch controlled by slave clock signals), the data output signal 118 depends upon the previously described operations of master latch 252. In other words, the output data signal 118 may not be equivalent to that of the input data signal 104 under these conditions (e.g., inverted slave clock signal is a logic high). Instead, the data output signal 118 also depends upon the state of the master clock signal and the inverted master clock signal, as described in more detail in FIG. 6.

Just the opposite of transmission gate 218, the transmission gate 220 is controlled by the slave clock signal. Transmission gate 220 receives the slave clock signal output by NAND gate 204 at the control terminal and the inverted control terminal of transmission gate 220 receives the inverted slave clock signal output by inverter 208. The input to the transmission gate 220 is coupled to an output of inverter 224. Inverter 224 inverts the data output signal output from inverter 222 and generates a signal that is the logical opposite of the data output signal 118. When the inverted slave clock signal is a logic high, the slave clock signal is a logic low. With a logic low control signal, transmission gate 220 acts as an open switch and the inverter 224 is floating. Alternatively, when the slave clock signal is a logic high, the inverted slave clock signal is a logic low. The slave clock signal controls the transmission gate 220, which for the reasons previously discussed causes the transmission gate to act as a closed switch. With transmission gate 220 as a closed switch, the output of inverter 224 is coupled to the input of inverter 222. The transmission gate 218 acts as an open circuit as the control signal under these circumstances (e.g., inverted slave clock signal is a logic low). For the time that the inverted slave clock signal is a logic low, the data latch signal 110 is no longer provided to the input of inverter 222. Instead, the input to inverter 222 is the output of inverter 224 passed through transmission gate 220. When the data output signal 118 is a logic high, inverter 224 outputs a logic low which is passed through the closed switch of transmission gate 220 to inverter 222. That logic low is then converted by inverter 222 back to a logic high. Alternatively, when the data output signal 118 is a logic low, inverter 224 outputs a logic high. That logic high is passed through the closed switch of transmission gate 220 to the input of inverter 222. Inverter 222 converts the logic high back to a logic low. In other words, when the slave clock signal is a logic high, the data output signal 118 output by slave latch 258 is maintained at its prior state (e.g., the state when the inverted slave clock signal was a logic low right before switching to a logic high).

Figure 4:
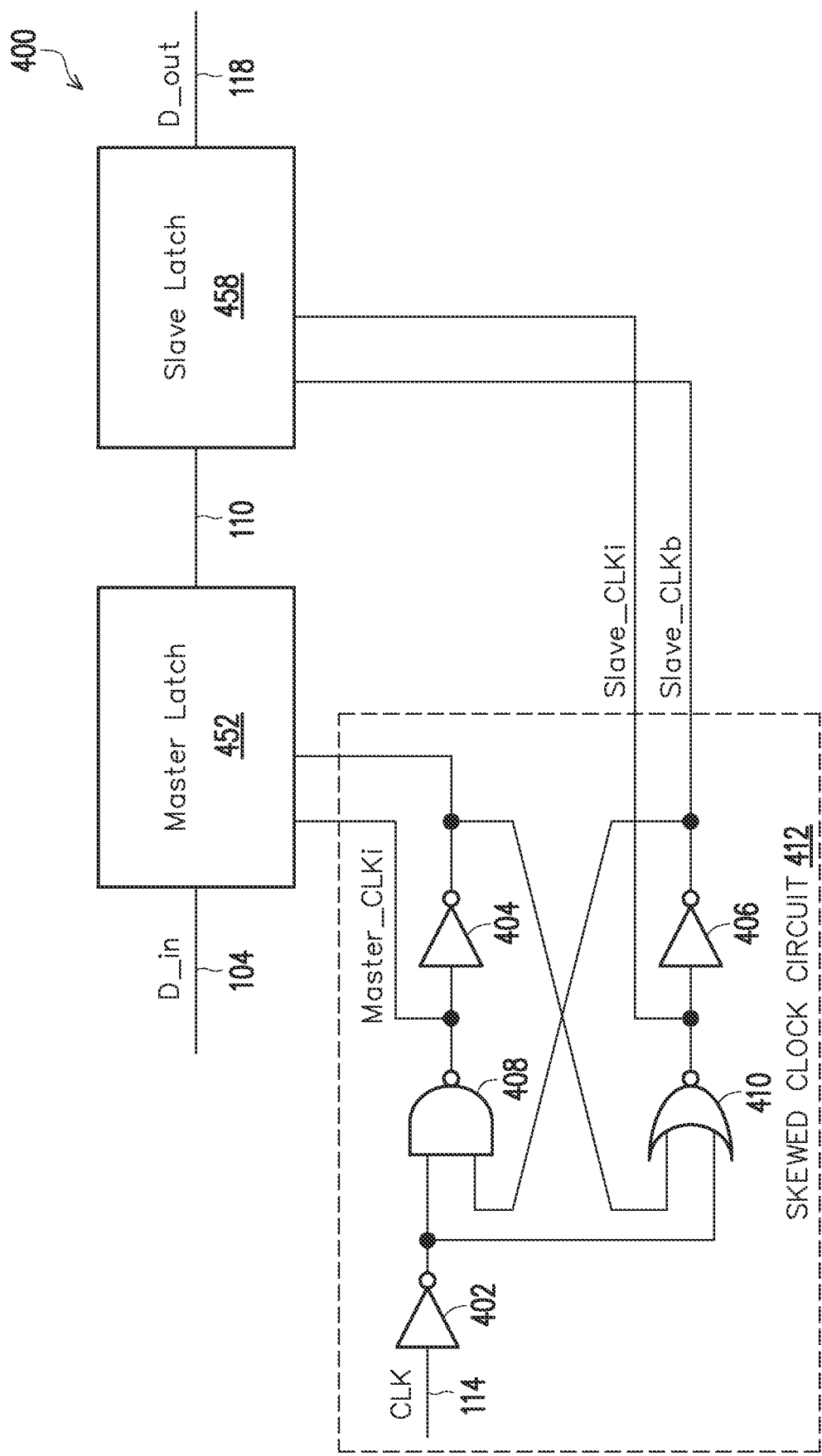
FIG. 4 depicts a diagram of a master-slave flip flop coupled to an example skewed clock circuit in accordance with various embodiments of the present disclosure.

FIG. 4 depicts a diagram of a master-slave flip flop 400 coupled to an example skewed clock circuit 412 in accordance with various embodiments of the present disclosure. As previously described in FIG. 1, a skewed clock circuit, such as skewed clock circuit 412, generates and provides individual clock signals (e.g., master clock signal, Master_CLKb, and slave clock signal, Slave_CLKb) to master latch 452 and slave latch 458, respectively. Master latch 452 operates the same as master latch 252 as described in FIG. 3. Slave latch 458 operates the same as slave latch 258. In addition to these clock signals, skewed clock circuitry 412 can also generate and provide inverted versions of both clock signals (e.g., an inverted master clock signal, Master_CLKi and an inverted slave clock signal, Slave_CLKi). In some variations, skewed clock circuitry 412 includes a plurality of logic gates such as inverters 402, 404, 406, NAND gate 408, and NOR gate 410. Skewed clock circuit 412 receives an input clock signal 114 (e.g., CLK). Input clock signal 114 is provided as input to inverter 402. Inverter 402 generates a logically opposite signal of input clock signal 114 and provides that to an input of NAND gate 408 and NOR gate 410. NAND gate 408 compares the inverted input clock signal output from inverter 402 with a slave clock signal (e.g., Slave_CLKb) output by inverter 406. NAND gate 408 generates an inverted master clock signal (e.g., Master_CLKi). When both the inverted clock signal from inverter 402 and the slave clock signal (e.g., Slave_CLKb) are logic are both logic highs, an inverted master clock signal generated by NAND gate 408 is a logic low. For all other logical combinations of inputs, the inverted master clock signal generated by NAND gate 408 is a logic high. Inverter 404 generates a master clock signal. Both the master clock signal and the inverted master clock signal are provided as inputs to the master latch 452.

The master clock signal output by inverter 404 is also provided as another input to the NOR gate 410. NOR gate 410 compares the inverted input clock signal with the master clock signal. When the inverted input clock signal and the master clock signal are both logic lows, the inverted slave clock signal generated by NOR gate 410 is a logic high. For all other logical combinations of inputs, the inverted slave clock signal generated by NOR gate 410 is a logic low. Inverter 406 generates a slave clock signal which is the logic opposite of the inverted slave clock signal generated by NOR gate 410. Both the slave clock signal and the inverted slave clock signal are provided as inputs to the slave latch 458.

Figure 5:
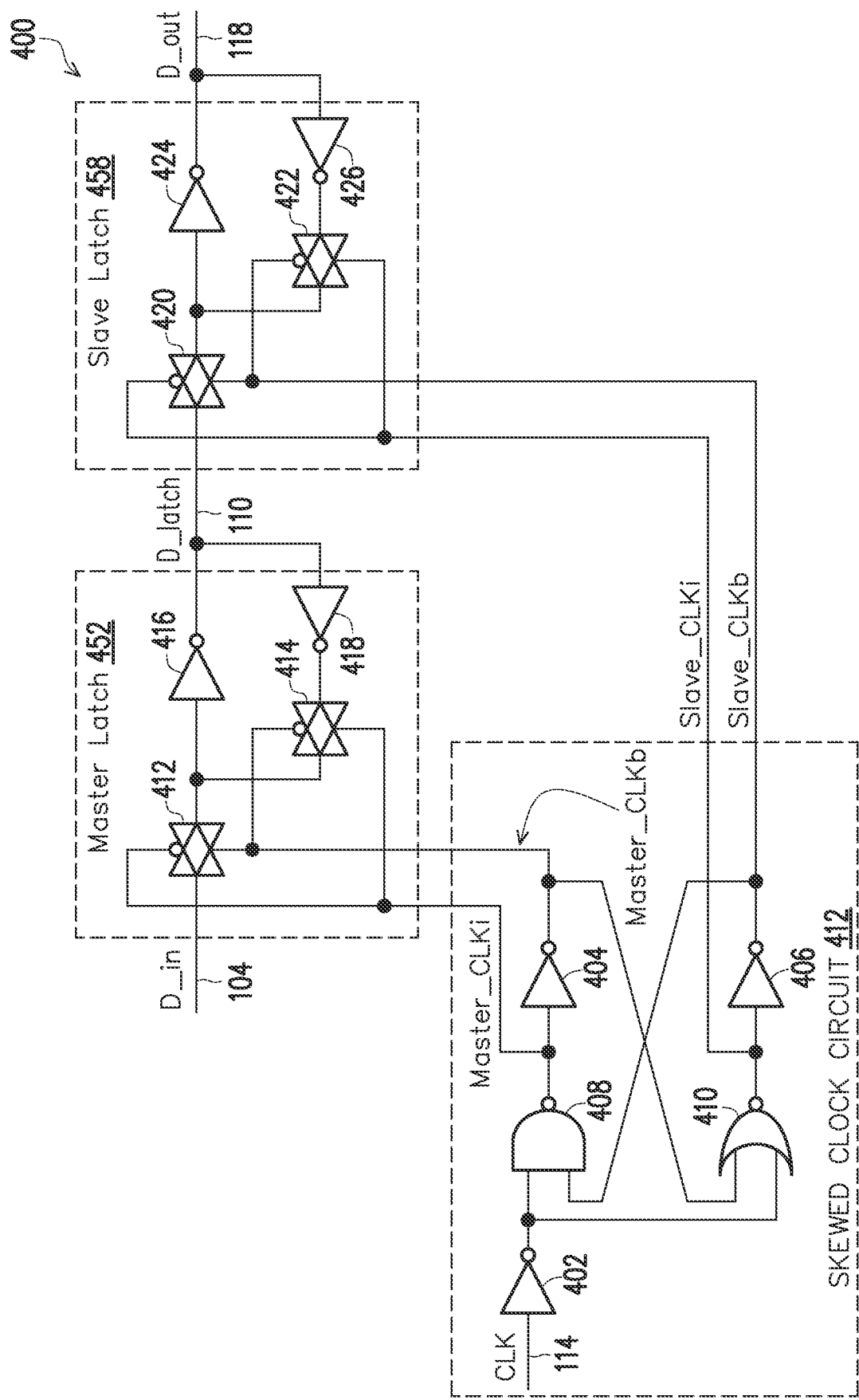
FIG. 5 further illustrates the coupling of a master-slave flip flop coupled to a skewed clock circuit in accordance with various embodiments of the present disclosure.

FIG. 5 further illustrates the coupling of a master-slave flip flop 400 coupled to a skewed clock circuit 412 in accordance with various embodiments of the present disclosure. The master latch 452 includes transmission gates 412, 414 and inverters 416, 418. Transmission gates 412, 414 operate similarly to transmission gates 210, 214, respectively, previously described in FIG. 3, with the exception being the sources of the master clock signal and the inverted master clock signal. Transmission gate 412 is controlled by the master clock signal generated by inverter 404. Transmission gate 414 is controlled by inverted master clock signal generated by NAND gate 408. All other operations of described in FIG. 3 for transmission gates 210, 214 apply to transmission gates 412, 414. Inverters 416, 418 operate the same as inverters 212, 216 described in FIG. 3.

Slave latch 458 includes transmission gates 420, 422 and inverters 424, 426. Transmission gates 420, 422 operate similarly to transmission gates 218, 220, respectively, as described in FIG. 3, with the exception being the sources of the slave clock signal and the inverted slave clock signal. Transmission gate 420 is controlled by inverted slave clock signal generated by NOR gate 410. Transmission gate 422 is controlled by the slave clock signal generated by inverter 406. All other operations of described in FIG. 3 for transmission gates 218, 220 apply to transmission gates 420, 422, respectively. Inverters 424, 426 operate the same as inverters 222, 224 described in FIG. 3.

The master latches 102, 252, 452 and slave latches 108, 258, 458 of FIGS. 2-5 are examples only, and master and slave latches may be implemented in various other ways that are known to those of ordinary skill in the art.

Figure 6:
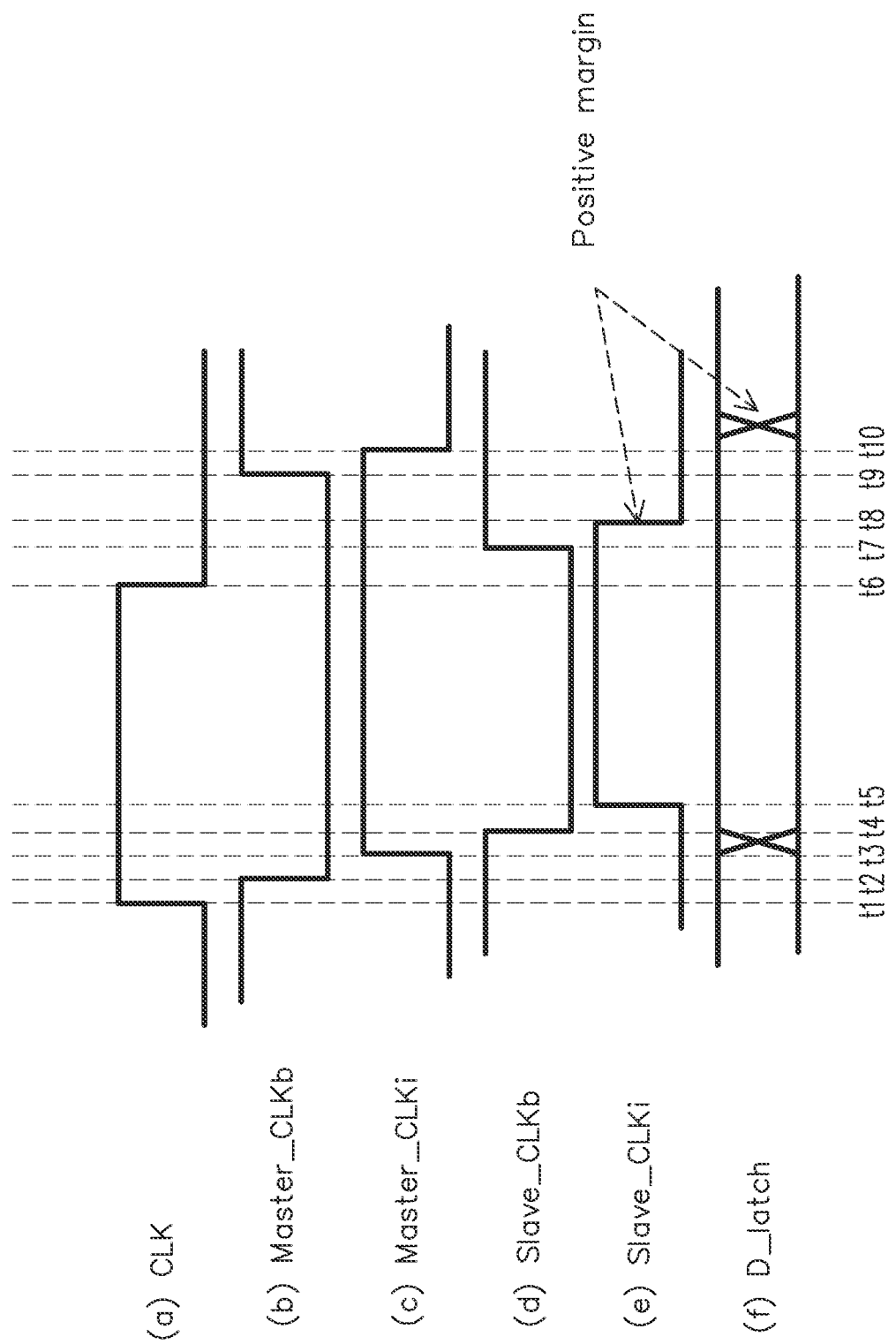
FIG. 6 is an exemplary timing diagram illustrating plots (a)-(f) of the various clock signals and data latch signal described in relation to FIGS. 2-3 in accordance with various embodiments of the present disclosure.

FIG. 6 is an exemplary timing diagram illustrating plots (a)-(f) of the various clock signals and data latch signal described in relation to FIGS. 2-3 in accordance with various embodiments of the present disclosure. Plot (a) illustrates a timing waveform for input clock signal 114 described in FIGS. 2-3. For example, plot (a) illustrates the clock signal 114 input into NOR gate 202 and NAND gate 204 of skewed clock circuit 212 in FIGS. 2-3. Plot (b) illustrates a timing waveform for the generated master clock signal (e.g., Master_CLKb) output from NOR gate 202 of skewed clock circuit 212 in FIGS. 2-3. When both the input clock signal 114 (e.g., CLK of plot (a)) and the inverted slave clock signal (e.g., Slave_CLKi of plot (e)) are logic lows, the NOR gate 202 generates a master clock signal (e.g., Master_CLKb of plot (b)) that is a logic high as illustrated before time t1, between times t9 and t10, and/or (iii) after time t10. For all other combinations of inputs, the master clock signal generated by NOR gate 202 (e.g., Master_CLKb of plot (b)) is a logic low as illustrated between times (i) t2 and t3, (ii) t3 and t4, (iii) t4 and t5, (iv) t5 and t6, (v) t6 and t7, and/or (vii) t7 and t8. It is noted that there is a small time delay illustrated in the waveform of plot (b) between transitioning from low/high or high/low (e.g., between times (i) t1 and t2 and/or (ii) t8 and t9) as detection of these changes may not be instantaneous.

Plot (c) illustrates a timing waveform for the inverted master clock signal (e.g., Master_CLKi) output from inverter 206 of skewed clock circuit 212 in FIGS. 2-3. Inverter 206 generates an inverted master clock signal that is the logical opposite of the master clock signal. For example, when the master clock signal (Master_CLKb of plot (b)) is a logic high, the inverted master clock signal (e.g., Master_CLKi of plot (c)) is a logic low as illustrated before time t1 and between times t1 and t2, and/or after time t10. When the master clock signal (Master_CLKb of plot (b)) is a logic low, the inverted master clock signal (e.g., Master_CLKi of plot (c)) is a logic high as illustrated between times (i) t3 and t4, (ii) t4 and t5, (ii) t5 and t6, (iv) t6 and t7, (v) t7 and t8, and/or (vi) t8 and t9. It is noted that there is a small time delay illustrated in the waveform of plot (c) between transitioning from low/high or high/low (e.g., between times (i) t2 and t3 and/or (ii) t9 and t10) as inversion of the input signal may not be instantaneous.

Plot (d) illustrates a timing waveform for the slave clock signal (e.g., Slave_CLKb) generated by NAND gate 204 of skewed clock circuit 212 in FIGS. 2-3. When the input clock signal 114 (e.g., CLK of plot (a)) and the inverted master clock signal (e.g., Master_CLKi of plot (c)) are both logic highs, the slave clock signal (e.g., Slave_CLKb) generated by NAND gate 204 is a logic low as illustrated between times (i) t4 and t5 and/or (ii) t5 and t6. For all other logical combinations of inputs, the slave clock signal (e.g., Slave_CLKb of plot (d)) generated by NAND gate 204 is a logic high as illustrated before time t1, between times (i) t1 and t2, (ii) t2 and t3, (iii) t6 and t7, (iv) t7 and t8, (v) t8 and t9, (vi) t9 and t10, and/or after time t10. It is noted that there is a small time delay illustrated in the waveform of plot (d) between transitioning from low/high or high/low (e.g., between times (i) t3 and t4 and/or (ii) t6 and t7) as detection of these changes may not be instantaneous.

Plot (e) illustrates a timing waveform for the inverted slave clock signal (e.g., Slave_CLKi) generated by inverter 208 of skewed clock circuit 212 in FIGS. 2-3. Inverter 208 generates an inverted slave clock signal (e.g., Slave_CLKi of plot (e)) which is the logic opposite of the slave clock signal (e.g., Slave_CLKb of plot (d)) generated by NAND gate 204. For example, when the slave clock signal (Slave_CLKb of plot (d)) is a logic high, the inverted slave clock signal (e.g., Slave_CLKi of plot (e)) is a logic low as illustrated before time t1, between times (i) t1 and t2, (ii) t2 and t3, (iii) t3 and t4, (iv) t7 and t8, (v) t8 and t9, (vi) t9 and t10, and/or after time t10. When the slave clock signal (Slave_CLKb of plot (d)) is a logic low, the inverted slave clock signal (e.g., Slave_CLKi of plot (e)) is a logic high as illustrated between times (i) t5 and t6 and/or (ii) t6 and t7. It is noted that there is a small time delay illustrated in the waveform of plot (e) between transitioning from low/high or high/low (e.g., between times (i) t4 and t5 and/or (ii) t7 and t8) as inversion of the input signal may not be instantaneous.

Plot (f) illustrates a timing waveform for the data latch signal 110 output from master latch 252 in FIGS. 2-3. 4-5. Comparing plot (e) with plot (f), the use of independently controlled clock signals facilitates a positive timing margin between the falling edge of the inverted clock signal and the timing window represented by an "X" on plot (f). This timing window reflects the combination of the setup time and the hold time for the flip-flop.

Figure 7:
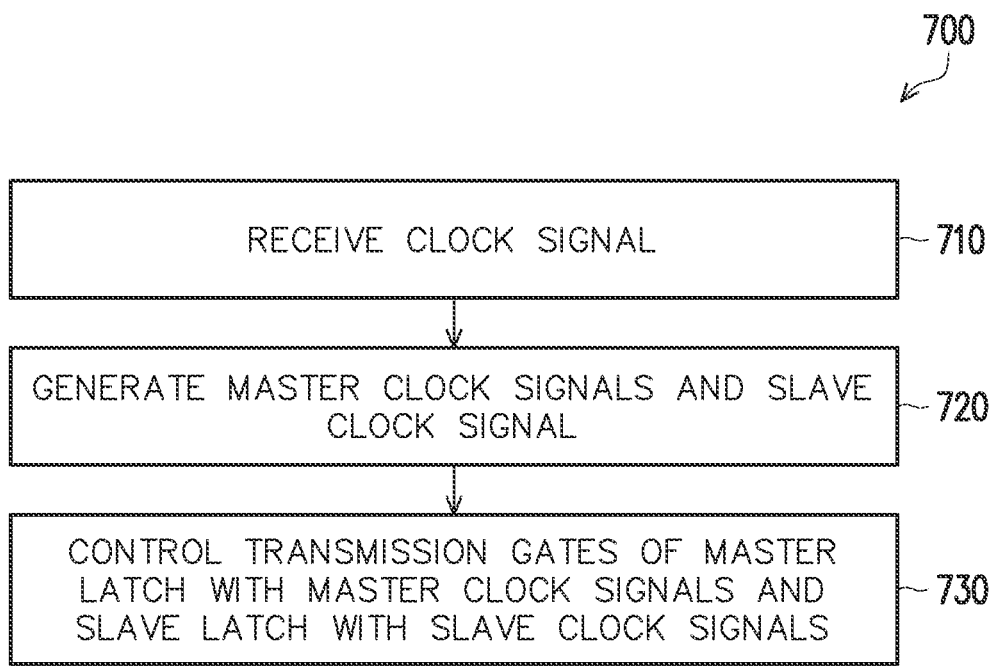
FIG. 7 is an exemplary flow chart illustrating a method for generating master clock signals and slave clock signals for controlling a flip-flop having a master latch and a slave latch in accordance with various embodiments of the present disclosure.

FIG. 7 is an exemplary flow chart illustrating a method for generating master clock signals and slave clock signals for controlling a flip-flop having a master latch and a slave latch in accordance with various embodiments of the present disclosure. While FIG. 7 is described here with reference to previously described structures for ease in understanding, it is understood that the method applies to many other structures as well. At step 710, a skewed clock circuit, such as skewed clock circuit 112 in FIG. 1, skewed clock circuit 212 in FIGS. 2-3, and/or skewed clock circuit 412 in FIGS. 4-5, receives a clock signal 114. The skewed clock circuit (e.g., skewed clock circuit 112 in FIG. 1, skewed clock circuit 212 in FIGS. 2-3, skewed clock circuit 412 in FIGS. 4-5) generates master clock signals (e.g., master clock signal (Master_CLKb) output from NOR gate 202 of skewed circuit 212 in FIGS. 2-3 or inverter 404 of skewed clock circuit 412 in FIGS. 4-5 and inverted master clock signal (Master_CLKi) output from inverter 206 of skewed clock circuit 212 in FIGS. 2-3 or NAND gate 408 of skewed clock circuit 412 in FIGS. 4-5) and slave clock signals (e.g., slave clock signal (Slave_CLKb) output from NAND gate 204 of skewed clock circuit in FIGS. 2-3 or inverter 406 of skewed clock circuit 412 in FIGS. 4-5 and inverted slave clock signal (Slave_CLKi) output from inverter 208 of skewed clock circuit 212 in FIGS. 2-3 or NOR gate 410 of skewed clock circuit 412 in FIGS. 4-5) at step 720. The master clock signal and the slave clock signal are independent clock signals. Transmission gates of the master latch (e.g., transmission gates 210, 214 of master latch 252 in FIG. 3, transmission gates 412, 414 of master latch 452 in FIG. 5) are controlled with the master clock signals (e.g., master clock signal and inverted master clock signal) and the transmission gate of the slave latch (e.g., transmission gates 218, 220 of slave latch 258 in FIG. 3, transmission gates 420, 422 of slave latch 458 in FIG. 5) are controlled with the slave clock signals (e.g., slave clock signal and inverted slave clock signal) at step 730.

Use of the various processes as described herein can provide a number of advantages. For example, use of the skewed clock circuits described herein can generate and provide individually controlled master and slave clock signals to master and slave latches of a flip-flop, respectively. These individually controlled clock signals can enable the flip-flop to have a faster setup time as the clock signals can be delayed individually and provided to the latches. These delayed clock signals can decrease the overall setup time (e.g., enabling a faster setup time).

In one embodiment, a circuit includes a master latch configured to latch an input data signal and to output a data latch signal based on a master latch clock signal. The circuit also includes a slave latch coupled to the master latch and configured to generate an output data signal based on a slave latch clock signal and the data latch signal. The circuit also includes a skewed clock circuit coupled to the master latch and the slave latch based on the clock signal. The skewed clock circuit is configured to receive a clock signal and generate the master latch clock signal and the slave latch clock signal. The master latch clock signal and the slave latch clock signal are independent clock signals whose timing is skewed relative to one another by the skewed clock circuit.

In another embodiment, a method of generating master clock signals and slave clock signals for controlling a flip-flop having a master latch and a slave latch includes receiving, by a skewed clock circuit, a clock signal. The skewed clock circuit generates master clock signals and slave clock signals. The master clock signal and the slave clock signal are independent clock signals. Transmission gates of the master latch is controlled with the master clock signals and the transmission gate of the slave latch is controlled with the slave clock signals.

In yet another embodiment, a device includes a data flip-flop comprising a plurality of latches and a clock circuit coupled to the data flip-flop. The clock circuit is configured to receive a clock signal and generate a plurality of clock signals. Each of the plurality of clock signals are independent of each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A circuit comprising:
   a master latch configured to receive at least two master clock signals, latch an input data signal, and to output a data latch signal based on the at least two master clock signals, wherein the at least two master clock signals include a master clock signal and an inverted master clock signal that is an inverted version of the master clock signal;
   a slave latch coupled to the master latch and configured to receive at least two slave clock signals and generate an output data signal based on the at least two slave clock signals and the data latch signal, wherein the at least two slave clock signals include a slave clock signal and an inverted slave clock signal that is an inverted version of the slave clock signal; and
   a skewed clock circuit coupled to the master latch and the slave latch comprising both of a NOR gate and a NAND gate, the skewed clock circuit configured to receive a clock signal and generate the at least two master clock signals and the at least two slave clock signals based on the clock signal, wherein the master clock signal and the slave clock signal are different clock signals whose timing is skewed relative to one another by the skewed clock circuit;
   wherein the NOR gate generates (i) the master clock signal as logic high when the clock signal and the inverted version of the slave clock signal are both logic low, and (ii) the master clock signal as logic low when one or more of the clock signal and the inverted version of the slave clock signal is logic high, and
   wherein the NAND gate generates (a) the slave clock signal as logic low when the clock signal and the inverted version of the slave clock signal are both logic high, and (b) the slave clock signal as logic high when one or more of the clock signal and the inverted version of the slave clock signal is logic low.

2. The circuit of claim 1, wherein the master clock signal and the slave clock signal being different clock signals facilitate a positive timing margin between the inverted slave clock signal and the data latch signal.

3. The circuit of claim 1, wherein the skewed clock circuit further comprises:
   a first inverter; and
   a second inverter;
   wherein:
      the NOR gate is configured to compare the clock signal with the inverted slave clock signal and generate the master clock signal;
      the first inverter is coupled between the NOR gate and the master latch, the first inverter configured to invert the master clock signal;
      the NAND gate is configured to compare the clock signal and the inverted master clock signal and generate a slave clock signal; and
      the second inverter is coupled between the NAND gate and the slave latch, the second inverter configured to invert the slave clock signal.

4. The circuit of claim 1, wherein the skewed clock circuit comprises:
   a first inverter;
   a second inverter; and
   a third inverter;
   wherein:
      the first inverter is configured to invert the clock signal;
      the NAND gate is coupled to the first inverter, the NAND gate configured to compare the inverted clock signal with the slave clock signal and generate the inverted master clock signal;
      the second inverter is coupled between the NAND gate and the master latch, the second inverter configured to invert the inverted master clock signal and generate the master clock signal;

the NOR gate is coupled between the first inverter and the third inverter, the NOR gate configured to compare the inverted clock signal with the master clock signal and generate the inverted slave clock signal; and the third inverter is coupled between the NOR gate and the slave latch, the third inverter configured to invert the inverted slave clock signal and generate the slave clock signal.

5. The circuit of claim 1, wherein the skewed clock circuit generates the inverted master clock signal that is provided to the master latch and wherein the master latch comprises:

a first transmission gate controlled by the master clock signal, the first transmission gate configured to operate as a closed switch when the master clock signal is a logic high and output the input data signal; and a first inverter coupled to the first transmission gate, the first inverter configured to invert the input data signal and output the data latch signal.

6. The circuit of claim 5, wherein the master latch further comprises:

a second inverter coupled to the first inverter, the second inverter configured to invert the data latch signal and output an inverted data latch signal; and a second transmission gate controlled by the inverted master clock signal, the second transmission gate configured to operate as a closed switch when the inverted master clock signal is a logic high and pass through the inverted data latch signal.

7. The circuit of claim 1, wherein the skewed clock circuit generates the inverted slave clock signal that is provided to the slave latch and wherein the slave latch comprises:

a first transmission gate controlled by the inverted slave clock signal, the first transmission gate configured to operate as a closed switch when the inverted slave clock signal is a logic high and output the data latch signal; and a first inverter coupled to the first transmission gate, the first inverter configured to invert the data latch signal and generate the output data signal.

8. The circuit of claim 7, wherein the slave latch further comprises:

a second inverter coupled to the first inverter, the second inverter configured to invert the output data signal and output an inverted output data signal; and a second transmission gate controlled by the slave clock signal, the second transmission gate configured to operate as a closed switch when the slave clock signal is a logic high and pass through the inverted output data signal to the first inverter.

9. A method of generating master clock signals and slave clock signals for controlling a flip-flop having a master latch and a slave latch, the method comprising:

receiving, by a skewed clock circuit, a clock signal;

generating, by the skewed clock circuit, at least two master clock signals and at least two slave clock signals, wherein the at least two master clock signals and the at least two slave clock signals are different clock signals, wherein the at least two master clock signals include a master clock signal and an inverted master clock signal that is an inverted version of the master clock signal and wherein the at least two slave clock signals include a slave clock signal and an inverted slave clock signal that is an inverted version of the slave clock signal;

providing the at least two master clock signals to the master latch and the at least two slave clock signals to the slave latch; and controlling transmission gates of the master latch with the at least two master clock signals and the slave latch with the at least two slave clock signals;

wherein the skewed clock circuit comprises both of a NOR gate and a NAND gate, wherein the NOR gate generates (i) the master clock signal as logic high when the clock signal and the inverted version of the slave clock signal are both logic low, and (ii) the master clock signal as logic low when one or more of the clock signal and the inverted version of the slave clock signal is logic high, and wherein the NAND gate generates (a) the slave clock signal as logic low when the clock signal and the inverted version of the slave clock signal are both logic high, and (b) the slave clock signal as logic high when one or more of the clock signal and the inverted version of the slave clock signal is logic low.

10. The method of claim 9, further comprising:

comparing, by the NOR gate of the skewed clock circuit, the clock signal with the inverted slave clock signal;

generating, by the NOR gate, the master clock signal based on the comparison of the clock signal with the inverted slave clock signal;

inverting, by a second inverter coupled between the NOR gate and the master latch, the master clock signal;

comparing, by the NAND gate, the clock signal and the inverted master clock signal;

generating, by the NAND gate, a slave clock signal based on the comparison of the clock signal and the inverted master clock signal; and inverting, by the first inverter coupled between the NAND gate and the slave latch, an output of the NAND gate.

11. The method of claim 9, further comprising:

inverting, by a first inverter of the skewed clock circuit, the clock signal;

comparing, by the NAND gate coupled to the first inverter, the inverted clock signal with the slave clock signal;

generating, by the NAND gate, the inverted master clock signal;

inverting, by a second inverter coupled between the NAND gate and the master latch, the inverted master clock signal;

generating, by the second inverter, the master clock signal;

comparing, by the NOR gate coupled to the first inverter, the master clock signal with the inverted clock signal;

generating, by the NOR gate, the inverted slave clock signal;

inverting, by a third inverter coupled between the NOR gate and the slave latch, the inverted slave clock signal; and generating by the third inverter, the slave clock signal.

12. The method of claim 9, further comprising:

generating, by the skewed clock circuit, the inverted master clock signal;

providing, by the skewed clock circuit, the inverted master clock signal and the master clock signal to the master latch;

controlling a first transmission gate of the master latch using the master clock signal, wherein the first transmission gate configured to operate as a closed switch when the master clock signal is a logic high and output the input data signal;

inverting, by a first inverter coupled to the first transmission gate, the input data signal; and
generating, by the first inverter, the data latch signal.

13. The method of claim 12, further comprising:
inverting, by a second inverter coupled to the first inverter, the data latch signal;
generating, by the second inverter, an inverted data latch signal; and
controlling a second transmission gate of the master latch using the inverted master clock signal, the second transmission gate configured to operate as a closed switch when the inverted master clock signal is a logic high and pass through the inverted data latch signal.

14. The method of claim 9, further comprising:
generating, by the skewed clock circuit, the inverted slave clock signal;
providing, by the skewed clock circuit, the slave clock signal and the inverted clock signal to the slave latch;
controlling a first transmission gate of the slave latch using the inverted slave clock signal, the first transmission gate configured to operate as a closed switch when the inverted slave clock signal is a logic high and output the data latch signal;
inverting, by a first inverter coupled to the first transmission gate, the data latch signal; and
generating, by the first inverter, the output data signal.

15. The method of claim 9, further comprising:
inverting, by a second inverter coupled to the first inverter, the output data signal and output an inverted output data signal; and
controlling a second transmission gate of the slave latch using the slave clock signal, the second transmission gate configured to operate as a closed switch when the slave clock signal is a logic high and pass through the inverted output data signal to the first inverter.

16. A device comprising:
a data flip-flop comprising a plurality of latches; and
a clock circuit coupled to the data flip-flop and comprising both of a NOR gate and a NAND gate, the clock circuit configured to receive a clock signal and generate a plurality of clock signals, each of the plurality of clock signals are different from each other, wherein the plurality of clock signals comprises at least two master clock signals including a master clock signal and an inverted master clock signal that is an inverted version of the master clock signal and at least two slave clock signals including a slave clock signal and an inverted slave clock signal that is an inverted version of the slave clock signal, wherein the at least two master clock signals and the at least two slave clock signals are provided to the plurality of latches;
wherein the NOR gate generates (i) the master clock signal as logic high when the clock signal and the inverted version of the slave clock signal are both logic low, and (ii) the master clock signal as logic low when one or more of the clock signal and the inverted version of the slave clock signal is logic high, and
wherein the NAND gate generates (a) the slave clock signal as logic low when the clock signal and the inverted version of the slave clock signal are both logic high, and (b) the slave clock signal as logic high when one or more of the clock signal and the inverted version of the slave clock signal is logic low.

17. The device of claim 16, wherein the clock circuit further comprises:
a first inverter; and
a second inverter;
wherein:
the NOR gate is configured to compare the clock signal with the inverted slave clock signal and generate a master clock signal;
the first inverter is coupled between the NOR gate and the data flip-flop, the first inverter configured to invert the master clock signal;
the NAND gate is configured to compare the clock signal and the inverted master clock signal and generate a slave clock signal;
the second inverter is coupled between the NAND gate and the data flip-flop, the second inverter configured to invert the slave clock signal; and
the plurality of clock signals comprise the inverted slave clock signal, the clock signal, and the master clock signal.

18. The device of claim 16, wherein the clock circuit further comprises:
a first inverter;
a second inverter; and
a third inverter;
wherein:
the first inverter is configured to invert the clock signal;
the NAND gate is coupled to the first inverter, the NAND gate configured to compare an inverted clock signal with the slave clock signal and generate the inverted master clock signal;
the second inverter is coupled between the NAND gate and the data flip-flop, the second inverter configured to invert the inverted master clock signal and generate the master clock signal;
the NOR gate is coupled between the first inverter and a third inverter, the NOR gate configured to compare the inverted clock signal with the master clock signal and generate the inverted slave clock signal;
the third inverter is coupled between the NOR gate and the slave latch, the third inverter configured to invert the inverted slave clock signal and generate the slave clock signal; and
the plurality of clock signals comprise the inverted slave clock signal, the clock signal, the master clock signal, and the inverted master slave clock.

19. The device of claim 16, wherein the clock circuit generates the inverted master clock signal that is provided to a master latch of the data flip-flop and wherein the master latch comprises:
a first transmission gate controlled by a master clock signal, the first transmission gate configured to operate as a closed switch when the master clock signal is a logic high and output a input data signal;
a first inverter coupled to the first transmission gate, the first inverter configured to invert the input data signal and output a data latch signal;
a second inverter coupled to the first inverter, the second inverter configured to invert the data latch signal and output an inverted data latch signal; and
a second transmission gate controlled by the inverted master clock signal, the second transmission gate configured to operate as a closed switch when the inverted master clock signal is a logic high and pass through the inverted data latch signal;
wherein the master clock signal and the slave clock signal being different clock signals facilitate a positive timing margin between the inverted slave clock signal and the data latch signal.

20. The device of claim 16, wherein the clock circuit generates the inverted slave clock signal that is provided to a slave latch of the data flip-flop and wherein the slave latch comprises:
- a first transmission gate controlled by the inverted slave clock signal, the first transmission gate configured to operate as a closed switch when the inverted slave clock signal is a logic high and output a data latch signal;
- a first inverter coupled to the first transmission gate, the first inverter configured to invert the data latch signal and generate the output data signal;
- a second inverter coupled to the first inverter, the second inverter configured to invert the output data signal and output an inverted output data signal; and
- a second transmission gate controlled by the slave clock signal, the second transmission gate configured to operate as a closed switch when the slave clock signal is a logic high and pass through the inverted output data signal to the first inverter.

* * * * *